United States Patent
Nikles

(10) Patent No.: US 11,627,423 B2
(45) Date of Patent: **\*Apr. 11, 2023**

(54) HEARING DEVICE

(71) Applicant: Sivantos Pte. Ltd., Singapore (SG)

(72) Inventor: Peter Nikles, Erlangen (DE)

(73) Assignee: Sivantos Pte. Ltd., Singapore (SG)

( \* ) Notice: Subject to any disclaimer, the term of this patent is extended or adjusted under 35 U.S.C. 154(b) by 0 days.

This patent is subject to a terminal disclaimer.

(21) Appl. No.: 17/728,161

(22) Filed: Apr. 25, 2022

(65) Prior Publication Data

US 2022/0248155 A1    Aug. 4, 2022

Related U.S. Application Data

(63) Continuation of application No. 16/952,594, filed on Nov. 19, 2020, now Pat. No. 11,343,627.

(30) Foreign Application Priority Data

Nov. 20, 2019    (DE) ...................... 10 2019 217 861.8

(51) Int. Cl.
*H04R 25/00* (2006.01)
*H05K 9/00* (2006.01)

(52) U.S. Cl.
CPC ......... *H04R 25/609* (2019.05); *H04R 25/554* (2013.01); *H04R 25/602* (2013.01);
(Continued)

(58) Field of Classification Search
CPC .. H04R 25/609; H04R 25/554; H04R 25/602; H04R 25/604; H04R 25/658; H04R 2225/57; H04R 2225/025; H04R 2225/51
See application file for complete search history.

(56) References Cited

U.S. PATENT DOCUMENTS 5,436,803 A    7/1995  Annis et al.
7,260,234 B2 \*  8/2007  Kasztelan ............ H04R 25/554
                                          381/189
(Continued)

FOREIGN PATENT DOCUMENTS

CN    202385276 U    8/2012
CN    104170407 A    11/2014
(Continued)

OTHER PUBLICATIONS

Tim Williams: "15.1.2 LF magnetic fields" In: "EMC for product Designers", Sep. 26, 2016 (Sep. 26, 2016), Newnes, Elsevier Science & Technology, XP055761165, ISBN: 978-0-08-101016-7 pp. 438-439.

(Continued)

*Primary Examiner* — Sunita Joshi
(74) *Attorney, Agent, or Firm* — Laurence A. Greenberg; Werner H. Stemer; Ralph E. Locher

(57) ABSTRACT

A hearing device has a housing in which a receiver is arranged as an electrical component. An antenna arrangement is formed, which has a winding in the form of a coil, which is arranged around the receiver with the interposition of a shielding foil. The shielding foil has a section extending around the receiver and several lugs adjoining it, which project beyond the receiver, the lugs enclosing between them an interspace adjoining the receiver. The shielding foil has in particular two layers, namely a magnetic layer and an electrical shielding layer. By this arrangement an antenna arrangement with high sensitivity is formed and at the same time a shielded partial area is created in the inter-space in which further components can be arranged. Due to the design of the lugs, which are particularly flexible, they can be attached to an inner wall of a housing.

20 Claims, 3 Drawing Sheets

(52) U.S. Cl.
CPC ......... *H04R 25/604* (2013.01); *H04R 25/658* (2013.01); *H05K 9/0084* (2013.01); *H04R 2225/025* (2013.01); *H04R 2225/51* (2013.01); *H04R 2225/57* (2019.05)

(56) References Cited

U.S. PATENT DOCUMENTS

| | | | |
|---|---|---|---|
| 8,649,542 | B2 | 2/2014 | Huettinger |
| 9,253,582 | B2 | 2/2016 | Nikles et al. |
| 9,426,588 | B2 | 8/2016 | Vonlanthen et al. |
| 9,521,494 | B2 | 12/2016 | Nikles et al. |
| 10,231,063 | B2 | 3/2019 | Nikles et al. |
| 10,536,788 | B2 | 1/2020 | Nikles et al. |
| 11,070,928 | B2 | 7/2021 | Meier et al. |
| 2011/0194717 | A1 | 8/2011 | Hansen et al. |
| 2016/0241063 | A1 | 8/2016 | Hatanaka et al. |
| 2017/0201821 | A1 | 7/2017 | McAuliffe et al. |
| 2019/0006757 | A1* | 1/2019 | Nikles ............... H01Q 7/06 |
| 2020/0068326 | A1 | 2/2020 | Kuhn et al. |

FOREIGN PATENT DOCUMENTS

| | | |
|---|---|---|
| CN | 104244156 A | 12/2014 |
| CN | 104779439 A | 7/2015 |
| CN | 107889554 A | 4/2018 |
| CN | 108322881 A | 7/2018 |
| DE | 10236940 B3 | 2/2004 |
| DE | 102018214199 B3 | 1/2020 |
| EP | 2811761 A1 | 12/2014 |
| EP | 3413587 A1 | 12/2018 |
| EP | 3520439 A1 | 8/2019 |
| GB | 2569536 A | 6/2019 |
| WO | 2018059688 A1 | 4/2018 |

OTHER PUBLICATIONS

Anonymous: "101 EMI Shielding Tips and Tricks" archived by Wayback Machine Internet Archive, Nov. 5, 2017 (Nov. 5, 2017), pp. 1-23, XP055793023, https://web.archive.org/web/20171105215145/ https://hollandshielding.com/q-tips-and tricks [retrieved Apr. 7, 2021].

* cited by examiner

HEARING DEVICE

CROSS-REFERENCE TO RELATED APPLICATION

This application is a continuation of patent application Ser. No. 16/952,594, filed Nov. 19, 2020; this application also claims the priority, under 35 U.S.C. § 119, of German patent application DE 10 2019 217 861, filed Nov. 20, 2019; the prior applications are herewith incorporated by reference in their entireties.

BACKGROUND OF THE INVENTION

Field of the Invention

The invention relates to a hearing device, in particular an in-the-ear (ITE) hearing aid.

The term "hearing device" is generally understood to mean a device that is configured to process and present sound or a sound signal to a person. The present invention specifically concerns a hearing aid. The term "hearing aid" is generally understood to mean a hearing device which serves to supply a hearing-impaired person with ambient acoustic signals. The acoustic signals of the environment are processed and especially amplified for the compensation or therapy of a respective hearing impairment. Such a hearing aid basically consists of one or more input transducers, a signal processing device, an amplification device and an output transducer. The input transducer is usually a receiving transducer, e.g. a microphone and/or an electromagnetic transducer, e.g. an induction coil. The output transducer is usually an electroacoustic transducer, e.g. a loudspeaker, or an electromechanical transducer, e.g. a bone conduction receiver. The electroacoustic transducer is also called a receiver. The output transducer generates output signals which are conducted to the auditory sense of the patient (hearing impaired person) and are intended to create a hearing perception of the patient. The amplifier is usually integrated into the signal processing equipment. The hearing device is powered by a battery integrated in the housing of the hearing device. Usually (hearing device) components are arranged on a printed circuit board as a circuit carrier or the components are connected to it.

There are different types of hearing devices, especially hearing aids. These are especially ITE hearing aids (In-the-Ear), BTE hearing aids (Behind the Ear), RiC hearing aids (Receiver in Canal), CiC hearing aids (Completely in Canal). The latter are similar to ITE hearing aids, but are worn completely in the ear canal. In ITE hearing aids, the housing, which contains all functional components including microphone and receiver, is worn at least partially in the ear canal. ITE or CiC hearing aids in particular therefore have a very small design.

Hearing devices, especially hearing aids, often have an antenna arrangement that is used, for example, for wireless transmission of data signals or acoustic signals. The antenna arrays can be configured for different purposes. For example, the antenna arrangement is used for wireless communication with another device, for example with another hearing aid in case of binaural fitting. Furthermore, such an antenna arrangement can also be designed for wireless communication with another external device, for example a music player. Furthermore, the antenna arrangement can also be used for wireless, especially inductive charging of a battery of the hearing aid. Due to the limited space available, shielding between the antenna array and other electrical components is often necessary and desired in order to avoid unwanted mutual interference.

In published, European patent application EP 2 811 761 A1, an ITE hearing aid is described, in which a shielding is arranged between a receiver and an antenna arrangement containing a coil, which shielding is integrally formed with a coil core.

Published, European patent application EP 3 413 587 A1 describes another hearing aid, in which a winding of an antenna array is arranged on an energy storage device (battery) with the interposition of a foil shield.

Especially for small hearing devices, the components of the hearing device must be arranged as compactly as possible. The mutual influence of the components due to electromagnetic influences can be problematic here. Especially an electro-magnetic output transducer (receiver) generates a strong radiation. The general aim is to achieve the highest possible sensitivity of the antenna arrangement with the lowest possible mutual interference.

BRIEF SUMMARY OF THE INVENTION

Based on this, an object of the invention to provide a hearing device with a compact antenna arrangement with high sensitivity.

The object is solved by a hearing device. The hearing device generally has a housing. This typically has an interior that changes in one direction. In the case of an ITE housing, the interior typically widens from one eardrum side of the housing to an opposite side. The "eardrum side" is the side of the housing with which the housing is inserted into the auditory canal so that this side faces the eardrum of a person.

The hearing device has at least one electrical component arranged in the housing, which extends in a longitudinal direction. This is generally a hearing device component, which therefore has a hearing device functionality. Preferably it is the receiver. Furthermore, an antenna arrangement is integrated in the housing, which has a winding that is arranged on the electrical component. Between the component and the winding there is a magnetic layer made of a magnetic, i.e. permeable material. The winding is wrapped around the electrical component in particular like a coil with an intermediate layer of a shielding foil. The magnetic layer has a section extending along the electrical component. Furthermore, the magnetic layer has at least one and preferably several lugs that are connected to this section and thus also to the electrical component in the longitudinal direction. The at least one lug and preferably the several lugs therefore protrude over the electrical component. The at least one projecting lug delimits an interspace, which is formed at least by a partial space of the interior of the housing. The interspace is limited on one side by the at least one lug and on the other side by an (opposite) inner wall of the housing. If there are several lugs, these preferably enclose the interspace between them.

The magnetic layer is functionally configured like a coil core, which has a positive influence on the sensitivity of the antenna arrangement. By continuing the magnetic layer beyond the component, this function of the coil core is enhanced. In addition, magnetic field lines are guided into and through this magnetic lug by the protruding magnetic lug, which means that the interspace is less exposed to magnetic fields than it would be without the at least one lug.

A particular advantage of this arrangement is therefore that—due to the lug that adjoins to the section and thus to the electrical component—an (additional) inter-space is formed, which defines an additional "shielded" section within the housing. This interspace is suitable for the arrangement of further hearing device components.

All in all, the continuation of the shielding with the help of the lugs provides a better shielding effect and thus also provides a shielding of the antenna arrangement against disturbing influences. This alone increases the sensitivity of the antenna arrangement. A further improvement of the sensitivity can be achieved by a suitable material selection of the shielding foil and/or the geometry of the lugs.

The interspace, in particular the interspace formed between two lugs, preferably widens in the longitudinal direction. A distance between the at least one lug and e.g. the opposite inner wall of the housing or also the distance between two in particular opposite lugs therefore increases when viewed in the longitudinal direction. This measure ensures the most efficient use of space possible, especially with ITE hearing aids. In such an ITE hearing aid, the device typically has a first housing section with a small cross-sectional area, adapted to the auditory canal, followed by a second, expanding housing section in which several other hearing device components are arranged. The electrical component surrounded by the shielding foil is located in the first housing section with the small cross-sectional area. The widening lugs therefore efficiently shield in particular the expanding interior of the second housing section.

In preferred embodiment, the at least one lug and preferably several, in particular all lugs abut at least partially and preferably flat against an inner wall of the housing. Preferably, the lug(s) is/are attached to this inner wall, for example by gluing. Depending on the design of the lugs and the flexibility of the lugs, they preferably conform to the contour of the inner wall and preferably over their entire surface.

Preferably at least one or several/all lugs are only partially widening, i.e. in a partial area they run parallel and only in a partial area they widen outwards towards the inner wall of the housing.

According to a further preferred embodiment it is furthermore intended that be-tween the at least one lug and the housing in addition to the (inner) interspace an (outer) further space (outer space) is formed, i.e. a space which is separated by the lug from the interspace. In this outer space there are preferably further hearing device components, especially those with low interference potential such as microphone, switches, programming contacts etc.

Preferably, one of the lugs is bent inwards for establishing the outer space. Other lugs are preferably bent outwards and widened.

The at least one, preferably all lugs have a length in the longitudinal direction preferably corresponding to at least 20%, preferably at least 50% and in particular at least 100% of the length of the section. Specifically, the length of the lugs is selected in such a way that—viewed in the longitudinal direction—they cover at least a large part, e.g. at least 75% or at least 90% of the length of the second housing part, so that at least a large part of the inner wall of the housing, in particular of the second housing part, is covered by the lugs (at least viewed in the longitudinal direction).

The lugs themselves preferably connect to the section in a flexible manner. This means that in the transition area between the section and the lugs, the latter can be bent flexibly so that they can take on different orientations in the longitudinal direction. Preferably, the lugs are designed to be (flexurally) flexible overall so that the desired adaptation to the inner wall is possible.

Depending on the structure of the lugs, they have higher or lower flexibility. In the case of lower flexibility, a joint is formed between the section and a respective lug in the manner of an articulated joint, at which the lug is bent relative to the section. The respective lug can basically be oriented in different angular orientations with respect to the longitudinal direction via this articulated joint. The articulated joint itself is designed in the manner of a film hinge, for example by introducing a material recess in the area of the articulated joint.

In a further preferred embodiment, several such articulated joints are formed over the length of the lug so that—even with stiff lugs—the lugs can be adapted to a desired course, in particular to the contour of the inner wall.

In a preferred embodiment, the magnetic layer has at least one magnetic foil, i.e. a foil made of a permeable material. In particular, the foil is a ferrite foil. In principle, the magnetic layer can also have several, for example strip-shaped foils. According to an embodiment, the magnetic layer consists of at least one magnetic foil.

The permeability number of the magnetic layer depends among other things on the frequency (resonance frequency) to which the antenna arrangement is tuned for transmission/reception of (data) signals. In the present case, the antenna arrangement is specifically designed for data transmission at frequencies in the megahertz range, especially in the range between 1 and 20 MHz, especially in the 3 MHz range. In principle, however, the antenna arrangement can also be configured for transmission/reception in the two or three-digit megahertz range (for example up to 300 MHz). For other applications, the antenna arrangement is tuned to a resonant frequency in the gigahertz range.

In alternative embodiments, the antenna arrangement is used for other applications, e.g. for inductive charging, typically at frequencies in the kHz range or as telecoil antennas for frequencies down to the Hz range.

The magnetic layer preferably—especially with an antenna arrangement tuned to the megahertz range, especially to the range between 1 and 20 MHz—has a permeability number in the range between 40 and 700, preferably in the range between 100 and 300. With increasing frequencies, for which the antenna arrangement is designed, smaller permeability numbers are chosen for the magnetic foil. The permeability number is at least >1, so that the magnetically permeable material used is at least paramagnetic. Preferably the permeability number is much higher than 1 (at least 5, preferably at least 10), so that the permeable material is generally ferromagnetic or ferrimagnetic.

In preferred embodiment, an electrical shielding layer is arranged in addition to the magnetic layer. This electrical shielding layer is arranged (only) in the area of the electrical component or (only) in the area of the projecting lug. Preferably, however, it extends—just like the magnetic layer—over the electrical component and forms projecting lugs.

The shielding layer effectively shields the interspace in particular, so that interference effects are reduced.

In particular, the electrical shielding layer is configured as a shielding foil at least in partial areas, especially in the area of the lugs. Preferably, the shielding layer is formed by one or more shielding foils.

In a particularly preferred design, the magnetic layer and the electrical shielding layer form a common shielding foil. This is therefore a multi-layer, especially two-layer foil with the electrical shielding layer, especially copper and the magnetic layer.

An "electrical shielding layer" is generally understood to be a highly conductive layer whose electrical conductivity is in particular much greater (e.g. by at least a factor of 5) than that of the magnetic layer. Conversely, the permeability of the magnetic layer is preferably greater, in particular significantly greater (at least by a factor of 5) than the permeability of the electrical shielding layer.

This foil construction provides at least a good shielding and on the other hand a high sensitivity of the antenna arrangement. In particular, this structure of the shielding foil ensures that at best only slight eddy currents are caused in the shielding foil and thus only a very low heating occurs. Furthermore the magnetic field lines run within the magnetic layer.

All in all, the interspace is quasi field-free (H-field, E-field)—with respect to external fields—and is particularly suitable for the arrangement of components. Conversely, components that may be located in the interspace are shielded from the outside and therefore have little or no effect on the performance of the antenna device.

A particular advantage has the shielding of the interspace if the antenna device is designed for inductive charging. During inductive charging, eddy currents are often induced in the housing of a battery, which, among other things, leads to an undesired heating of the battery. Due to a preferred arrangement of the battery in the interspace, the battery is therefore arranged quasi in field-free space, so that no eddy currents are induced.

The at least one lug, especially the several lugs is/are formed by the multilayer shielding foil or at least comprise this multilayer shielding foil.

Preferably, the electrical shielding layer is oriented towards the electrical component and the magnetic layer towards the winding. The magnetic layer is therefore arranged further outwards relative to the electrical shield layer.

In preferred further embodiment the electrical shielding layer is thinner than the magnetic layer. The magnetic layer preferably has a thickness in the range of at least 25 µm, preferably at least 50 µm or at least 100 µm. The maximum thick-ness is, for example, 500 µm and preferably 200 or 300 µm. In some versions, the thickness of the magnetic layer, especially the thickness of the ferrite foil, is in the range of 200 to 300 µm. This—compared to very thin layers in the range of 25 µm to 100 µm, for example—results in good performance and high sensitivity of the antenna arrangement. At the same time, the (bending) flexibility of the magnetic layer, and thus of the entire shielding foil, is reduced. In contrast, thin magnetic layers with a thickness in the range between 25 µm and 100 µm, for example, have a significantly higher bending flexibility.

The thickness of the electrical shielding layer, especially the copper foil or copper layer, is typically in the range between 5 µm and 50 µm and preferably typically in the range between 15 to 35 µm. For applications in a low frequency range, e.g. for inductive charging, thicker foils, e.g. with a thickness in the range between 40 µm and 80 µm, are preferably used.

Preferably, the electrical shielding layer, preferably at the end of the shielding foil opposite the lugs, protrudes in longitudinal direction over the magnetic layer. In this way, improved shielding is achieved in the end area of the shielding foil so that the spatial area, especially within the section in which the electrical component is arranged, is also as unaffected as possible by the electromagnetic field of the antenna arrangement. This minimizes possible interference fields that penetrate into the area surrounded by the section.

In a preferred embodiment, the magnetic and electrical shielding layers of the shielding foil are congruent, i.e. they lie completely on top of each other. This allows easy production, e.g. by creating the desired shape and geometry of the shielding foil by a punching process.

The total length of the section typically corresponds to the length of the electrical component. This is often in the range of, for example, between 3 and 7 mm, especially around 5 mm. The magnetic layer, for example, is set back in the longitudinal direction by a range of 5% to 20% of the length of the section compared to the electrical shielding layer.

In a first variant, the lugs preferably have a constant width over their length.

In a preferred embodiment, the width of the electrical and/or magnetic shielding layer widens. Preferably, the electrical shielding layer widens compared to the magnetic layer. In particular, only the electrical shielding layer widens in the area of a respective lug, starting from the section. The respective magnetic layer in the area of a respective lug is preferably continued in strips with preferably constant width, whereas the width of the electrical shielding layer increases. The widening of the electrical shielding layer provides improved shielding of the widening inter-space.

Preferably the shielding layer in the area of the lugs is closed in the circumference, in particular it is closed continuously, i.e. there are no gaps or free spaces between (in circumferential direction) adjacent areas of the lugs. Preferably, the shielding layer is at least largely closed on the circumference. This means that in the circumferential direction the free spaces in which no shielding layer is arranged are less than 20% or less than 10% of the circumference. Due to the high flexibility of the electrical shielding layer, the shielding layer can easily be adapted to the inner wall. At the same time, it is sufficient for the sensitivity of the antenna arrangement if the magnetic layer is only continued in strips in the lugs.

In principle, a high overlap in the circumferential direction with the magnetic layer can also be provided. However, overlapping of the magnetic layer with the shielding layer of an adjacent lug should be avoided.

Preferably, the magnetic layer is formed by individual strips that are at least partially and preferably completely separated from one another and extend in the longitudinal direction. These therefore extend in particular over the section and then merge into a respective lug adjoining the section.

The shielding layer can also be formed by individual strips. For example, several strips of shielding foil are provided, each of which is attached to one side surface of the component, in particular by adhesive bonding.

The magnetic layer is generally applied to the shielding layer, especially to the shielding foil, especially by gluing. This applies especially for the embodiment of the magnetic layer as one or more foils (ferrite foil). The individual strips are preferably each formed by one foil.

Both the electrical shielding layer and the magnetic layer are formed in preferred embodiments by a foil section and another section, e.g. a rigid section with high inherent rigidity.

According to a first variant, the magnetic shielding layer in the area of the component, i.e. in the section, is formed by a suitable choice of material of the component housing. The housing therefore consists of a magnetic material or is surrounded by a housing jacket made of the magnetic material. This material is for example a magnetic (injection) molding material, especially an injection molded ferrite. This casting material consists for example of the magnetic material or it is a plastic casting material with magnetic particles embedded in a plastic matrix. The lugs made of the magnetic material or the multi-layer shielding foil are attached to this housing, for example, are fixed to it, especially by adhesive bonding.

According to another variant, which can also be combined with the previous variant, the electrical shielding layer in the area of the component, i.e. in the section, is formed by a suitable choice of material for the housing of the component. The housing therefore consists of a material with high electrical conductivity or at least has a corresponding shield wall area. At least one lug is attached to this housing.

Preferably, further hearing device components are arranged in the space between the hearing devices. These further components benefit from the shielding so that the antenna arrangement and these hearing device components are mutually unaffected as far as possible. In addition to the one electrical component, which is wrapped by the winding/coil, several other components are arranged in the shield-ed interspace. In particular, these are, for example, one or more of the components battery, integrated circuits (e.g. a high-frequency circuit, charging circuit), components of a signal processing device, such as amplifiers, filters, etc.

A decisive advantage of the shielding of the interspace by the lugs is particularly to be seen in the fact that comparable electromagnetic conditions are created for different hearing devices, especially for the arrangement of these additional hearing components, so that the mutual influences are at least largely identical across different hearing devices. Especially in the case of ITE or CiC hearing aids, the housings are often designed as so-called customized shells. This typically changes the space available and the arrangement of the individual components can vary from hearing device to hearing device. Due to the shielding of the interspace and the arrangement of the further hearing components in this interspace, even with such customized shells and at least largely identical performance/property profile is achieved across different hearing devices and individual adjustments etc. are not necessary or at least reduced.

In a preferred further embodiment, a printed circuit board foil is provided, which comprises the shielding layer and/or the magnetic layer. In particular, the printed circuit board foil comprises the shielding layer. Printed circuit board foil is generally understood to be a foil-like carrier, which consists of a non-conductive plastic material and on which conductor tracks are preferably attached. In particular, the electrical shielding layer is configured as a plane or layer of this printed circuit board foil. In particular, the printed circuit board foil has a conductive layer, especially a copper layer, which is designed as a ground plane. The magnetic layer is preferably applied to the printed circuit board foil by gluing.

Preferably one of the further electrical components is arranged at the printed circuit board foil, in particular also electrically contacted, for example over the conductor paths integrated into the printed circuit board foil. The further electrical component is oriented towards the interspace. These components are especially disturbing components. Due to their arrangement on the foil, the conditions, such as a signal-to-noise ratio, remain the same regardless of the special design of the housing. This is of particular importance for housings that are individually adapted to the user, since the geometry of these housings can differ from hearing device to hearing device and thus also the arrangement and position of the components.

The electrical component, which is surrounded by the section of the shielding foil, is in particular a receiver/loudspeaker, i.e. an electromagnetic transducer. During operation, it generates a very strong electromagnetic field, which is reliably shielded by the shielding foil towards the antenna arrangement.

In a preferred design, the lugs are designed as reflection surfaces for HF radiation, in particular by the electrical shielding foil. HF is understood to be radiation in the gigahertz range, especially in the single-digit gigahertz range, for example in the 2.4 GHz range. In some applications, especially for so-called HF applications, wireless communication or data transmission takes place in such a high frequency range. It is desirable that the radiation is not emitted in the direction of the head, since the HF radiation is strongly absorbed there. The design of the HF reflection surface, which is created in particular by the electrical shielding layer, ensures that an HF wave is either emitted in a directional manner or that it is prevented from entering the head area. This HF reflection surface, which is created by the lugs, is in particular in contact with the inner wall of the housing and preferably over the entire surface.

The electrical component is typically a cuboid component, i.e. it has a square cross-section (possibly with rounded corner edges). The strip-like design of the magnetic layer also ensures that the shielding foil is free of the magnetic layer in areas of corner edges (which extend in longitudinal direction). Since this is thicker, typically much thicker than the electrical shielding layer, the thickness of the shielding foil is significantly reduced at least in the corner areas. This results in a better adaptation to the housing in the area of the electrical components. The electrical component is typically located in the first section of the housing, which is inserted into the auditory canal when worn, so that the housing here typically has a rounded cross-sectional contour adapted to the auditory canal. The interior space in the area of the first housing section is typically completely filled by the electrical component (with the antenna arrangement around it). In this respect, the first housing section typically forms a channel adapted to the electrical component, into which it is inserted.

Alternatively, a strip of the shielding foil is applied to each side surface of the electrical component so that the edges of the component are free of the shielding foil in each case.

The section is arranged around the cuboid body of the electrical component, thus around the longitudinal direction. The opposite front sides are preferably left free, so only the lateral outer surface of the electrical component is covered. The winding is then wound around the section of the shielding foil like a coil. The winding is only present in the section. The electrical component does not necessarily have to be completely covered by the section of the shielding foil. A separating gap or slit on opposite edges can exist without any significant impairment of the functionality. Preferably, the electrical component is in circumferential direction completely sur-rounded by the section.

The coil is preferably configured like an air coil in its initial state, i.e. the individual windings surround an (air) free space. During assembly, such a coil is pushed onto the electrical component provided with the shielding foil. The coil, generally the winding, is electrically contacted in a suitable manner and connected to a transmitting and/or receiving device.

Other features which are considered as characteristic for the invention are set forth in the appended claims.

Although the invention is illustrated and described herein as embodied in a hearing device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
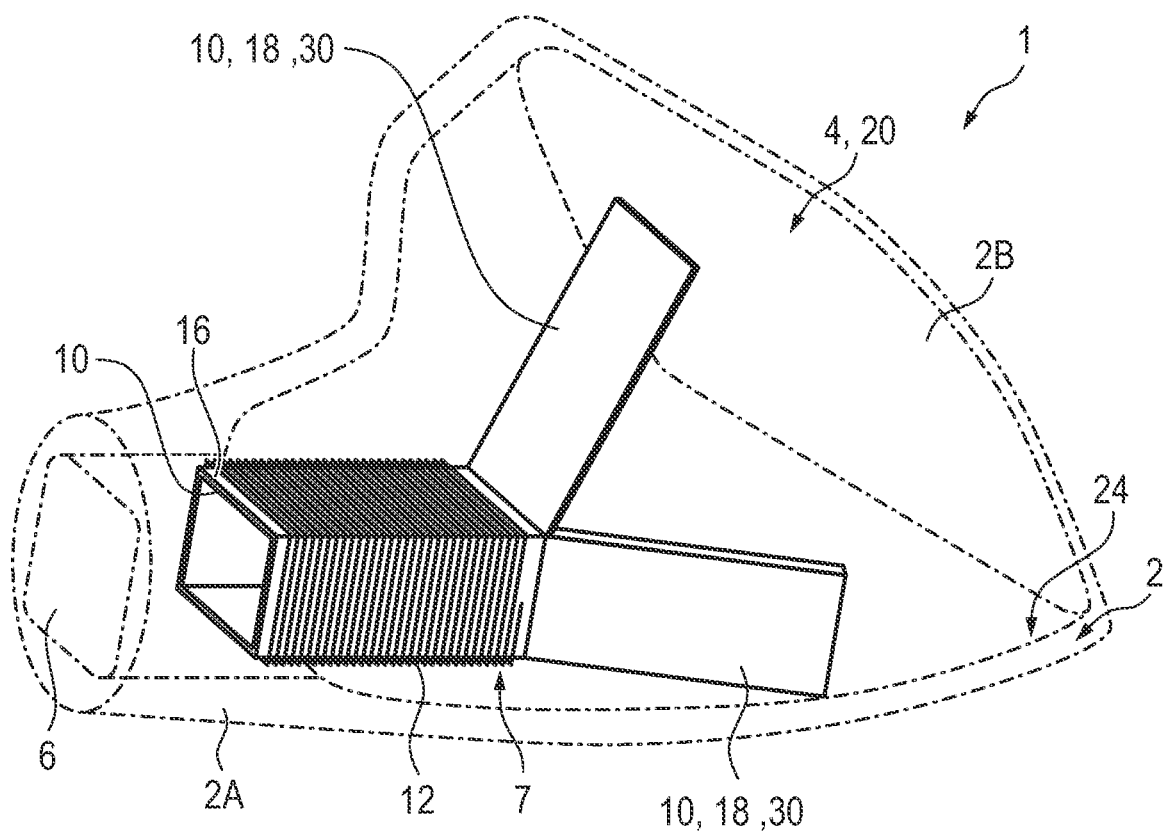
FIG. 1 is an illustration of a housing of an ITE hearing aid with an antenna arrangement inside.

In the figures, parts with the same effect are marked with the same reference numerals.

Referring now to the figures of the drawings in detail and first, particularly to FIG. 1 thereof, there is shown partially an ITE hearing aid 1. A housing 2 has a first housing section 2A and an adjacent second housing section 2B. The first housing section 2A extends from one eardrum side end towards the second housing section, which ends on a side facing away from the eardrum. The first housing section 2A is configured for at least partial insertion into the auditory canal of a person, particularly a hearing-impaired person. Starting from the first housing section 2A, the second housing section 2B follows and expands. This creates a widening interior 4.

The second housing section 2B has a relatively large opening at the end. This is typically closed by a faceplate, that means a component carrier on which connectors, operating elements or even hearing components are often arranged. Housing 2 contains further components, some of which are not shown here, such as battery, signal processing, microphones, etc.

The first housing section 2A has a sound channel 6 at the end on the eardrum side, from which sound exits in the direction of the eardrum. In the first housing section 2A, the electrical component is usually a receiver 8, which extends at least a short distance into sound channel 6 (receiver 8 is not shown in FIG. 1). Inside the housing 2 an antenna arrangement 7 is inserted, which has a shielding foil 10 and a coil winding 12 as essential components. The winding 12 as well as a part of the shielding foil 10 surrounds a free space in which the receiver 8 is located, as can be seen in particular from the illustration in FIG. 2. Winding 12 is only arranged in the area of the receiver 8. This free space, and thus the free space surrounded by winding 12, extends in a longitudinal direction 14 (FIG. 2), which is oriented away from the eardrum side of the housing 2.

The shielding foil 10 generally has a section 16, which is placed around the circumference of the receiver 8. This section 16 is followed by individual (shielding) lugs 18, viewed in longitudinal direction 14. With these lugs 18 the shielding foil 10 is continued. In the typical design of the receiver 8 as a cuboidal component, one cuboidal side is continued by each lug 18. The individual lugs 18 are separated from each other at least outside the section 16. The winding 12 is only arranged around the shielding foil 10 in the area of the section 16.

Subsequent to the section 16, the lugs 18 widen, so that an interspace 20 formed between the lugs 18 widens—seen in the longitudinal direction 14. To make this possible, the respective lugs 18 form an angle to the longitudinal direction. In particular, an articulated joint 22 is formed at the transition between each lug 18 and the section 16, at which each lug 18 is bent. The articulated joint 22, for example, is a foil hinge formed by a material recess of the shielding foil 10. Each joint 22 is oriented perpendicular to the longitudinal direction 14 and parallel to a front edge of the receiver 8.

As an alternative to the design of such an articulated joint 22, the shielding foil 10 and especially the lugs 18 have a sufficiently good bending flexibility so that they can be easily bent over due to their bending flexibility.

In particular, the individual lugs 18 adjoin against an inner wall 24 of the housing 2, especially in the area of the second, expanding housing section 2B. Preferably, the lugs 18 are attached to the inner wall 24 at least at certain points or even over a large area, especially by gluing.

The shielding foil 10 has a multi-layer design and has at least two layers, namely a magnetic layer 26, which is formed in particular by one or more ferrite foils, and an electrical shielding layer 28, which is formed in particular by a foil or layer with good electrical conductivity. The electrically conductive material is in particular copper. The electrical shielding layer is oriented towards the receiver 8 and the magnetic layer 26 is arranged between the electrical shielding layer 28 and the winding 12.

In a first version, the shielding foil 10 is formed by the electrical shielding layer 28, in particular copper foil, and the magnetic layer 26, which is attached to it in particular by adhesive bonding. The magnetic layer 26 is applied, for example, over the entire surface of the shielding layer 28. However, the magnetic layer 26 is preferably formed by individual strips 30 extending in longitudinal direction (see FIG. 4), which are applied individually to the electrical shielding layer (especially copper foil) 28. These individual strips 30 are foil-like strips, especially ferrite foil strips.

Figure 2:
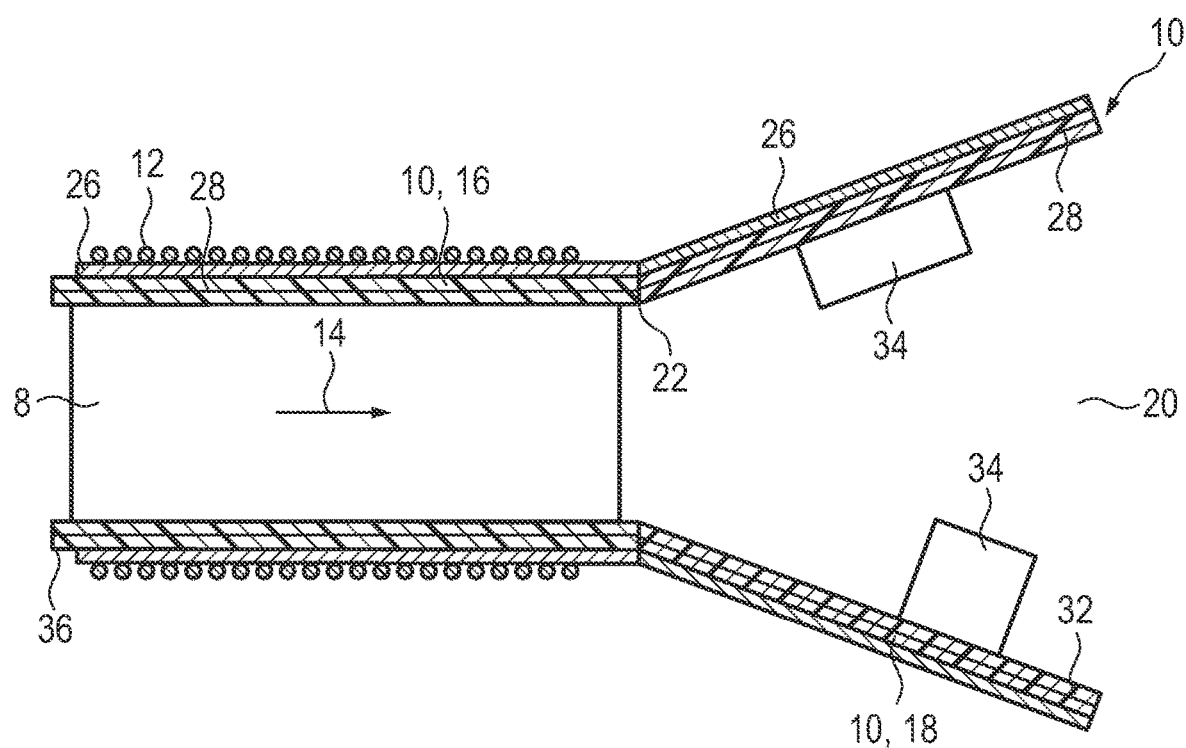
FIG. 2 is a diagrammatic, longitudinal sectional view of the antenna arrangement with a receiver.

The embodiment of FIG. 2 shows a version of the shielding foil 10 with a printed circuit board foil 32 (PCB foil). In this version, the electrical shielding layer 28 is formed by a conductive layer of the PCB foil 32. In particular, this is, for example, an intermediate layer that is formed between two insulating plastic layers of the PCB foil 32. In principle, the shielding layer 28 can also be applied to one side of an insulating carrier foil of the PCB foil 32. Onto the PCB foil 32 with the integrated shielding layer 28 is applied on the outside the magnetic layer 26. Here, too, the magnetic layer is preferably formed by individual strips 30.

The magnetic layer 26 is in turn applied to the printed circuit board foil 32, for example by gluing. Furthermore, FIG. 2 shows the winding 10 applied on the outside.

In the longitudinal direction 14 following the receiver 8 and thus also the section 16, the individual lugs 18 are disposed, of which two opposite lugs 18 can be seen in the cross-sectional view of FIG. 2. As shown in FIG. 2, further electrical components 34 are preferably arranged directly at the PCB foil 32 and, for example, are also electrically contacted via the PCB foil 32. For this purpose, the PCB foil 32 has conductor tracks and/or further conductive intermediate layers in addition to the shielding layer 28, via which the components 34 are electrically connected to each other.

Figure 3:
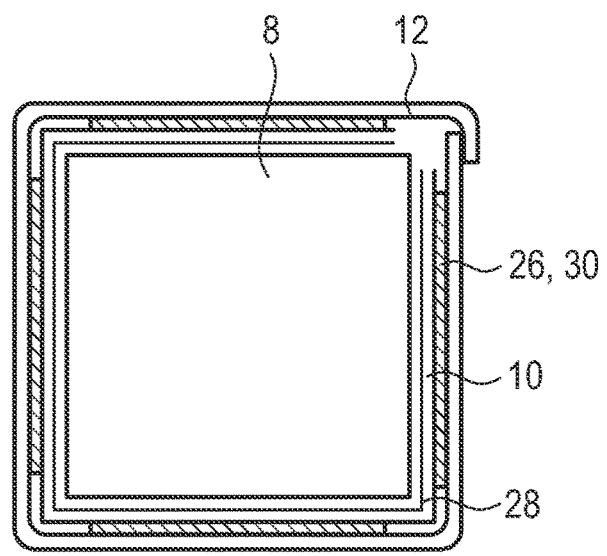
FIG. 3 is a front view of the antenna arrangement with the receiver.

Referring to FIG. 3 the structure of the antenna arrangement 4 can be seen. The quadrangular receiver 8, viewed in cross section, is located on the inside. The electrical shielding layer 28 is arranged around the circumference of the receiver. The shielding layer 28 is preferably wrapped around the circumference without interruptions around the receiver 8. A separating gap can be formed in a joint or corner area, as shown in FIG. 3.

Furthermore, the individual stripes 30 of the magnetic layer 26 can be seen, which are thus each arranged on one of the cuboid sides. Finally, winding 12 is arranged around the shielding foil 10.

Figure 4:
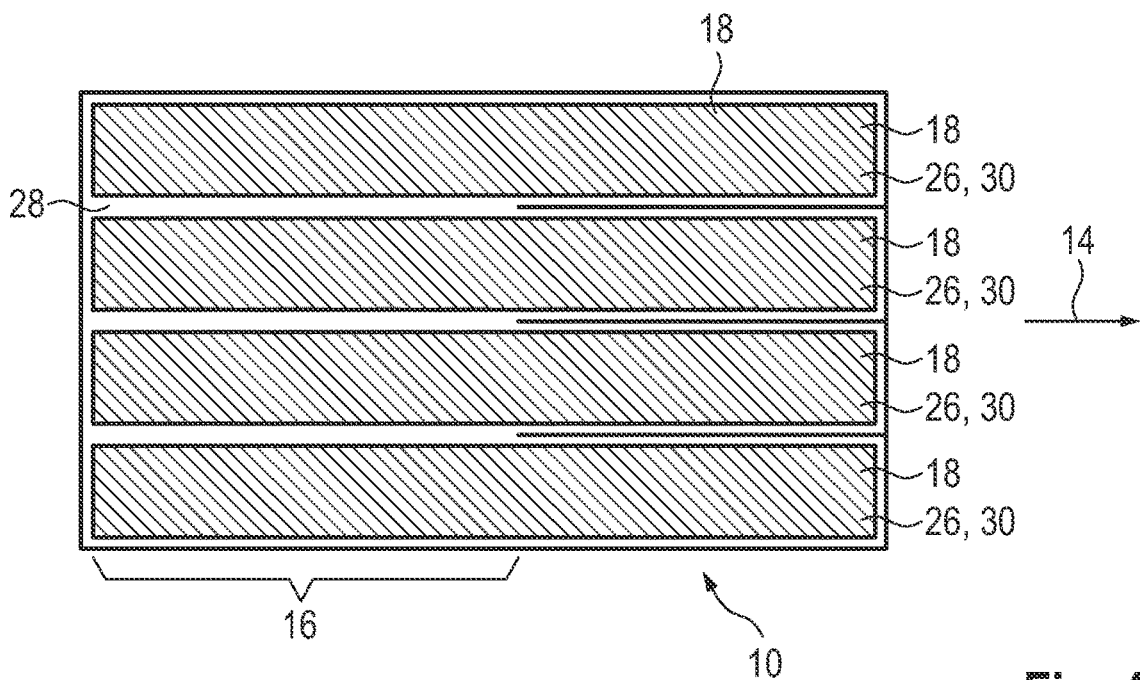
FIG. 4 is a top view of a shielding foil according to a first embodiment.

Different embodiments and geometries are possible for the design of the shielding foil 10. FIG. 4 shows a preferred design in which the shielding foil 10 is formed by a rectangular electrical shielding layer 28, for example, which is slit over a partial area when viewed in longitudinal direction 12. In this partial area, the individual lugs 18 are formed by the slits. The unslotted area forms the section 16. Strips 30 are applied to this electrical shielding layer 28—exactly one for each cuboid side. These strips 30 extend continuously over the section 16 and over the lugs 18.

In the preferred design, the electrical shielding layer 28 protrudes over the magnetic layer 26 in an end area 36, especially in the direction opposite to the longitudinal direction 14. This can be seen in particular in FIG. 2. The shielding layer 28 protrudes over the magnetic layer 26 in the direction of the eardrum side and on the side facing away from the lugs 18. The projection is, for example, between 3% and 10% of the length of section 16 in the longitudinal direction 14. At the opposite end of the shielding foil 10, the magnetic layer 26 extends to the end of the shielding layer 28. Alternatively, the magnetic layer 26 can be set back slightly. Therefore, the magnetic layer 26 extends at least largely over the entire length of the electrical shielding layer 28.

An alternative embodiment is explained in connection with FIG. 5. In this case, the lugs 18 projecting beyond section 16 each have a widening electrical shielding layer 28. For example, the width of the shielding layer 28 widens from the start of lug 18 on section 16 by at least 30%, 50%, 100%, 200% or even more (relative to the width at the start of lug 18 on section 16). Each of the typically four lugs 18 is de-signed in this way. Preferably, the widening is selected in such a way that when the lugs 18 are expanded and adapted against the inner wall 24 of the housing 2, the inner wall 24 is completely or at least largely completely covered by the shielding layer 28 in the circumferential direction. Thus, the entire interspace 20 is shielded by the electrical shielding layer 28.

Figure 5:
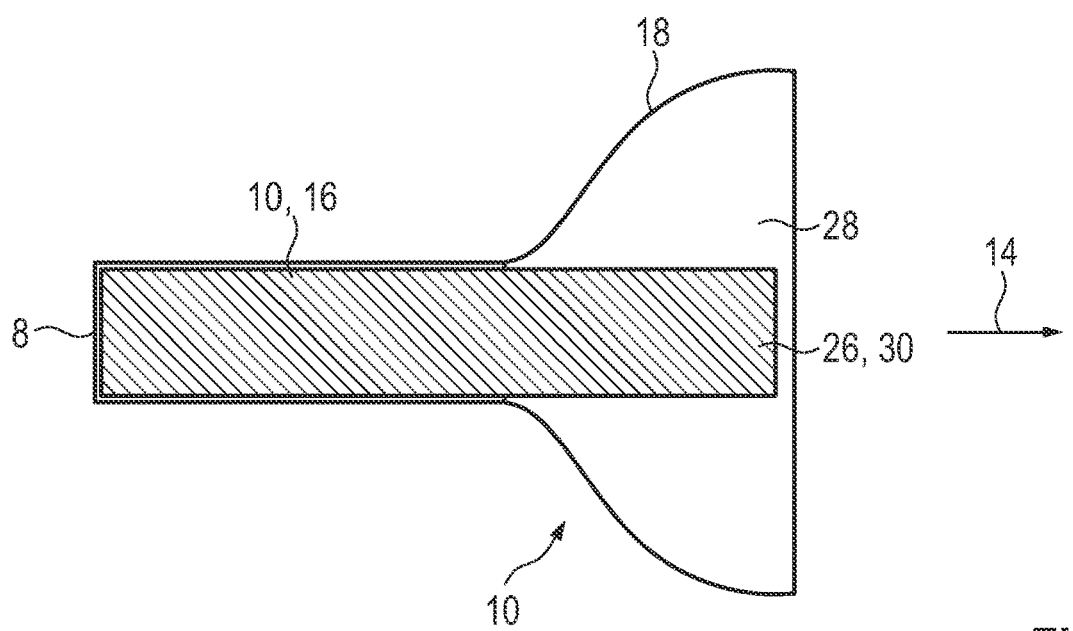
FIG. 5 is a side view of a shielding foil arranged around the receiver.

As can be seen in particular in FIG. 5, each strip 30 of the magnetic layer 26 is continued unchanged in the area of the respective lug 18, i.e. it is not widened. Alternatively, the magnetic layer 26 is also designed to be widened.

The invention was explained in more detail in the present case in connection with an ITE hearing aid 1. In principle, the antenna arrangement 4 described here can also be applied to other hearing aids and, in general, to hearing devices that are specially worn on the head. The electrical component surrounded by section 16 does not necessarily have to be the receiver 8. The antenna arrangement 7 de-scribed here is preferably used for data transmission in the MHz range. In addition, it is used additionally or alternatively for inductive charging or also as a tele-coil.

The invention is therefore not limited to the design examples described here. Rather, other variants can be derived from it without leaving the subject matter of the invention. In particular, all individual features described in connection with the design examples can be combined with each other in other ways without leaving the subject matter of the invention.

REFERENCE LIST 1 hearing device
2 housing
2A, B first, second housing section
4 interior
6 Sound channel
7 Antenna arrangement
8 Receiver
10 Shielding foil
12 Winding
14 longitudinal direction
16 Section
18 lugs
20 Interspace
22 articulated joint
24 inner wall
26 magnetic position
28 electrical shielding layer
30 strips
32 circuit board foil
34 further electrical component
36 end area

The invention claimed is:

1. A hearing device, comprising:
a housing;
at least one electrical component disposed in said housing, said at least one electrical component extending in a longitudinal direction from a first end to a second end;
an antenna configuration having a winding disposed on said at least one electrical component; and
a magnetic layer disposed between said winding and said at least one electrical component, said magnetic layer having a section disposed on said at least one electrical component and lugs adjoining said section in the longitudinal direction, all of said lugs projecting beyond said second end of said at least one electrical component in the longitudinal direction, said lugs delimiting an interspace adjoining said second end of said at least one electrical component in the longitudinal direction.

2. The hearing device according to claim 1, wherein said interspace widens when viewed in the longitudinal direction.

3. The hearing device according to claim 1, wherein said housing has an inner wall and said at least one lug at least partially abuts said inner wall.

4. The hearing device according to claim 1, wherein said at least one lug is flexible in bending or connects to said section via at least one articulated joint.

5. The hearing device according to claim 1, wherein said magnetic layer contains a foil.

6. The hearing device according to claim 1, further comprising an electrical shielding layer in addition to said magnetic layer.

7. The hearing device according to claim 6, wherein said electrical shielding layer is disposed in an area which is selected at least from one of an area of said at least one electrical component and an area of said at least one lug.

8. The hearing device according to claim 6, wherein said electrical shielding layer is formed at least in some areas as a shielding foil.

9. The hearing device according to claim 6, wherein said magnetic layer and said electrical shielding layer form a multi-layer shielding foil at least in partial areas.

10. The hearing device according to claim 6, wherein said electrical shielding layer is thinner than said magnetic layer.

11. The hearing device according to claim 6, wherein said electrical shielding layer projects beyond said magnetic layer in the longitudinal direction.

12. The hearing device according to claim 6, wherein at least one of said electrical shielding layer or said magnetic layer widens in a region of said at least one lug starting from said section.

13. The hearing device according to claim 6, wherein said electrical shielding layer in an area of said at least one lug is at least largely or completely closed in a circumference.

14. The hearing device according to claim 6, wherein said magnetic layer is formed by individual strips which are applied to said electrical shielding layer.

15. The hearing device according to claim 1, further comprising at least one further component disposed in said interspace, said at least one further component is selected from the group consisting of: a battery, an integrated circuit, a signal processing device, a charging coil, a telecoil and additional coils.

16. The hearing device according to claim 1, further comprising a printed circuit board foil having at least one layer selected formed from said magnetic layer or said electrical shielding layer.

17. The hearing device according to claim 16, further comprising a further electrical component disposed on said printed circuit board foil, said further electrical component is disposed in said interspace.

18. The hearing device according to claim 1, where said at least one electrical component is a receiver.

19. The hearing device according to claim 1, wherein said at least one lug is configured as reflecting surfaces for high frequency radiation.

20. The hearing device according to claim 1, wherein the hearing device is an in-the-ear hearing device.

* * * * *